United States Patent
Suzuki et al.

(10) Patent No.: US 8,174,873 B2
(45) Date of Patent: May 8, 2012

(54) MAGNETIC RANDOM ACCESS MEMORY AND INITIALIZING METHOD FOR THE SAME

(75) Inventors: Tetsuhiro Suzuki, Tokyo (JP);
Shunsuke Fukami, Tokyo (JP);
Norikazu Ohshima, Tokyo (JP);
Kiyokazu Nagahara, Tokyo (JP);
Nobuyuki Ishiwata, Tokyo (JP)

(73) Assignee: NEC Corporation, Tokyo (JP)

( * ) Notice: Subject to any disclaimer, the term of this patent is extended or adjusted under 35 U.S.C. 154(b) by 82 days.

(21) Appl. No.: 12/863,740

(22) PCT Filed: Dec. 10, 2008

(86) PCT No.: PCT/JP2008/072379
§ 371 (c)(1),
(2), (4) Date: Aug. 19, 2010

(87) PCT Pub. No.: WO2009/093387
PCT Pub. Date: Jul. 30, 2009

(65) Prior Publication Data
US 2010/0315854 A1 Dec. 16, 2010

(30) Foreign Application Priority Data
Jan. 25, 2008 (JP) .................................. 2008-015489

(51) Int. Cl.
*G11C 11/00* (2006.01)
*G11C 11/14* (2006.01)
*G11C 11/15* (2006.01)

(52) U.S. Cl. .......................... 365/158; 365/171; 365/173

(58) Field of Classification Search .................. 365/158, 365/171, 173
See application file for complete search history.

(56) References Cited

U.S. PATENT DOCUMENTS

| 6,834,005 | B1 | 12/2004 | Parkin |
|---|---|---|---|
| 7,525,862 | B1 * | 4/2009 | Sun et al. ....................... 365/158 |
| 7,532,502 | B2 * | 5/2009 | Saito ............................. 365/158 |
| 7,848,137 | B2 * | 12/2010 | Fukami et al. ................ 365/158 |

(Continued)

FOREIGN PATENT DOCUMENTS

JP    2005093488 A    4/2005
(Continued)

OTHER PUBLICATIONS

International Search Report for PCT/JP2008/072379 mailed Mar. 10, 2009.
D. Ravelosona et al., "Threshold currents to move domain walls in films with perpendicular anisotropy", Applied Physics Letters, 90, 2007, pp. 072508-1-072508-3.
A. Yamaguchi et al., "Reduction of Threshold Current Density for Current-Driven Domain Wall Motion using Shape Control", Japanese Journal of Applied Physics, vol. 45, No. 5A, 2006, pp. 3850-3853.

(Continued)

Primary Examiner — Trong Phan

(57) ABSTRACT

A domain wall motion type MRAM has: a magnetic recording layer 10 having perpendicular magnetic anisotropy; and a pair of terminals 51 and 52 used for supplying a current to the magnetic recording layer 10. The magnetic recording layer 10 has: a first magnetization region 11 connected to one of the pair of terminals; a second magnetization region 12 connected to the other of the pair of terminals; and a magnetization switching region 13 connecting between the first magnetization region 11 and the second magnetization region 12 and having reversible magnetization. A first pinning site PS1, by which the domain wall is trapped, is formed at a boundary between the first magnetization region 11 and the magnetization switching region 13. A second pinning site PS2, by which the domain wall is trapped, is formed at a boundary between the second magnetization region 12 and the magnetization switching region 13. A third pinning site PS3, by which the domain wall is trapped, is formed within the first magnetization region 11.

13 Claims, 10 Drawing Sheets

U.S. PATENT DOCUMENTS

| | | | |
|---|---|---|---|
| 7,869,266 B2* | 1/2011 | Ranjan et al. | 365/158 |
| 7,929,342 B2* | 4/2011 | Numata et al. | 365/158 |
| 7,936,627 B2* | 5/2011 | Fukami | 365/158 |
| 8,040,724 B2* | 10/2011 | Suzuki et al. | 365/173 |

FOREIGN PATENT DOCUMENTS

| | | |
|---|---|---|
| JP | 2005191032 A | 7/2005 |
| JP | 2006073930 A | 3/2006 |
| JP | 2007221131 A | 8/2007 |
| JP | 2007227923 A | 9/2007 |
| WO | 2005069368 A | 7/2005 |
| WO | 2007020823 A | 2/2007 |

OTHER PUBLICATIONS

A Yamaguchi et al., "Real-Space Observation of Current-Driven Domain Wall Motion in Submicron Magnetic Wires", Physical Review Letters, vol. 92, No. 7, Feb. 20, 2004, pp. 077205-1-077205-4.

J. C. Slonczewski, "Current-driven excitation of magnetic multilayers", Journal of Magnetism and Magnetic Materials, 159, L1-L7, 1996.

* cited by examiner

US 8,174,873 B2

MAGNETIC RANDOM ACCESS MEMORY AND INITIALIZING METHOD FOR THE SAME

TECHNICAL FIELD

The present invention relates to a domain wall motion type magnetic random access memory (MRAM: Magnetic Random Access Memory). In particular, the present invention relates to a domain wall motion type MRAM using a magnetic layer having perpendicular magnetic anisotropy, and a method of initializing the same.

BACKGROUND ART

An MRAM is a promising nonvolatile memory from a viewpoint of high integration and high-speed operation. In the MRAM, a magnetoresistance element that exhibits a "magnetoresistance effect" such as TMR (Tunnel MagnetoResistance) effect is utilized. In the magnetoresistance element, for example, a magnetic tunnel junction (MTJ: Magnetic Tunnel Junction) in which a tunnel barrier layer is sandwiched by two ferromagnetic layers is formed. The two ferromagnetic layers include a magnetization fixed layer (pinned layer) whose magnetization direction is fixed and a magnetization free layer (free layer) whose magnetization direction is reversible.

It is known that a resistance value (R+ΔR) of the MTJ when the magnetization directions of the pinned layer and the free layer are "anti-parallel" to each other becomes larger than a resistance value (R) when the magnetization directions are "parallel" to each other due to the magnetoresistance effect. The MRAM uses the magnetoresistance element having the MTJ as a memory cell and nonvolatilely stores data by utilizing the change in the resistance value. For example, the anti-parallel state is related to data "1" and the parallel state is related to data "0". Data writing to the memory cell is performed by switching the magnetization direction of the free layer.

Conventionally known methods of data writing to the MRAM include an "asteroid method" and a "toggle method". According to these write methods, a magnetic switching field necessary for switching the magnetization direction of the free layer increases in substantially inverse proportion to a size of the memory cell. That is to say, a write current tends to increase with the miniaturization of the memory cell.

As a write method capable of suppressing the increase in the write current with the miniaturization, there is proposed a "spin transfer method" (for example, refer to Japanese Patent Publication JP-2005-093488A, and J. C. Slonczewski, Current-driven excitation of magnetic multilayers, Journal of Magnetism and Magnetic Materials, 159, L1-L7, 1996). According to the spin transfer method, a spin-polarized current is injected to a ferromagnetic conductor, and direct interaction between spin of conduction electrons of the current and magnetic moment of the conductor causes the magnetization to be switched (hereinafter referred to as "Spin Transfer Magnetization Switching").

U.S. Pat. No. 6,834,005 discloses a magnetic shift resister that utilizes the spin transfer. The magnetic shift resister stores data by utilizing a domain wall in a magnetic body. In the magnetic body having a large number of separated regions (magnetic domains), a current is so supplied as to pass through the domain wall and the current causes the domain wall to move. The magnetization direction in each of the regions is treated as a record data. For example, such a magnetic shift resister is used for recording large quantities of serial data. It should be noted that the domain wall motion in a magnetic body is reported also in Yamaguchi et al., Real-Space Observation of Current-Driven Domain Wall Motion in Submicron Magnetic Wires, PRL, Vol. 92, pp. 077205-1-4, 2004.

A "domain wall motion type MRAM" that utilizes the current-driven domain wall motion is described in Japanese Patent Publication JP-2005-191032A and International Publication WO 2007/020823. According to the MRAM described in these documents, a magnetization fixed layer whose magnetization direction is fixed and a domain wall motion layer connected to the magnetization fixed layer through a tunnel insulating layer form an MTJ. The domain wall moves in the domain wall motion layer, and a resistance value of the MTJ, namely a memory data varies depending on a location of the domain wall. Moreover, the domain wall motion layer includes not only a domain wall motion section whose magnetization direction is reversible but also a section whose magnetization direction does not substantially change. In this sense, the domain wall motion layer is hereinafter referred to not as a magnetization free layer but as a "magnetic recording layer".

FIG. 1 shows a structure of a magnetic recording layer 100 described in Japanese Patent Publication JP-2005-191032A. The magnetic recording layer 100 has a linear shape. More specifically, the magnetic recording layer 100 has a connector section 103 overlapping with the tunnel insulating layer and the magnetization fixed layer, constricted sections 104 adjacent to both ends of the connector section 103, and a pair of magnetization fixed sections 101 and 102 respectively formed adjacent to the constricted sections 104. The magnetization fixed sections 101 and 102 are respectively provided with fixed magnetizations whose directions are opposite to each other. Furthermore, write terminals 105 and 106 are electrically connected to the magnetization fixed sections 101 and 102, respectively. By using the write terminals 105 and 106, a write current penetrating through the connector section 103, the pair of constricted sections 104 and the pair of magnetization fixed sections 101 and 102 in the magnetic recording layer 100 can be supplied.

FIG. 2 shows a structure of a magnetic recording layer 110 described in International Publication WO/2007/020823. The magnetic recording layer 110 has a U-shape. More specifically, the magnetic recording layer 110 has a first magnetization fixed region 111, a second magnetization fixed region 112 and a magnetization switching region 113. The magnetization switching region 113 overlaps with a magnetization fixed layer 130. The magnetization fixed regions 111 and 112 are so formed as to extend in a Y direction, and the magnetization directions thereof are fixed in the same direction. On the other hand, the magnetization switching region 113 is so formed as to extend in a X direction and has reversible magnetization. Therefore, a domain wall is formed at a boundary B1 between the first magnetization fixed region 111 and the magnetization switching region 113 or at a boundary B2 between the second magnetization fixed region 112 and the magnetization switching region 113. Moreover, the magnetization fixed regions 111 and 112 are connected to current supply terminals 115 and 116, respectively. By using these current supply terminals 115 and 116, it is possible to flow a write current in the magnetic recording layer 110. The domain wall moves within the magnetization switching region 113 depending on a direction of the write current. The magnetization direction of the magnetization switching region 113 can be controlled by the domain wall motion.

DISCLOSURE OF INVENTION

In the case of the above-mentioned MRAM using the current-driven domain wall motion, there is fear that an absolute value of the write current becomes relatively large. There are a lot of reports on observation of the current-driven domain wall motion besides the above-mentioned paper (Yamaguchi et al., Real-Space Observation of Current-Driven Domain Wall Motion in Submicron Magnetic Wires, PRL, Vol. 92, pp. 077205-1-4, 2004), and threshold current density required for the domain wall motion is in general about $1 \times 10^8$ A/cm$^2$. Therefore, when a width and a thickness of the magnetic recording layer are 100 nm and 10 nm, respectively, for example, the write current of about 1 mA is necessary. In order to further reduce the write current, the film thickness may be made further smaller. In this case, however, it is known that the threshold current density required for the writing is increased (refer to, for example, Yamaguchi et al., Reduction of Threshold Current Density for Current-Driven Domain Wall Motion using Shape Control, Japanese Journal of Applied Physics, vol. 45, No. 5A, pp. 3850-3853, 2006).

Meanwhile, in a case of an element that uses perpendicular magnetic anisotropy material whose magnetic anisotropy is perpendicular to a substrate surface, the threshold current density of on the order of 106 A/cm2 has been observed (refer to, for example, Ravelosona et al., Threshold currents to move domain walls in films with perpendicular anisotropy, Applied Physics Letters, 90, 072508, 2007). Therefore, in the domain wall motion type MRAM, reduction in the write current can be expected by applying perpendicular magnetic anisotropy material to the magnetic recording layer.

FIGS. 3A and 3B respectively are a plan view and a cross-sectional view showing an example of the magnetic recording layer in the case where the perpendicular magnetic anisotropy material is applied. As shown in FIGS. 3A and 3B, the magnetic recording layer 120 has a connector section 123, constricted sections 124a and 124b adjacent to both ends of the connector section 123, and a pair of magnetization fixed sections 121 and 122 respectively formed adjacent to the constricted sections. Since the magnetic recording layer 120 has the perpendicular magnetic anisotropy, its magnetization direction is in the +Z direction or the −Z direction. In order to achieve the domain wall motion type MRAM, it is necessary to initialize magnetization state such that a domain wall is formed near the constricted section 124a or 124b. In other words, it is necessary to perform initialization such that respective magnetizations of the magnetization fixed sections 121 and 122 are directed in the opposite directions along the Z direction. However, it is difficult to initialize the respective magnetization directions of the magnetization fixed sections 121 and 122 to be in the opposite directions by applying an external magnetic field.

In the case where the magnetic recording layer 110 has in-plane magnetic anisotropy and its shape is the U-shape as shown in the foregoing FIG. 2, it is possible to initialize the magnetization state with comparative ease by using an external magnetic field. For example, a sufficiently-large external magnetic field is applied to the magnetic recording layer 110 at an angle of 45-degrees in the XY plane. After the application of the external magnetic field is stopped, the magnetizations of the magnetization fixed regions 111 and 112 are directed in the +Y direction and the magnetization of the magnetization switching region 113 is directed in the +X direction, and thus a state in which a domain wall is formed at the boundary B1 is achieved. That is, it is possible to easily initialize the magnetization state of the magnetic recording layer 110 and the domain wall position. In the case of the perpendicular magnetic anisotropy, however, it is difficult to initialize the magnetization state to a desired state by using an external magnetic field, even when the magnetic recording layer has the U-shape.

An object of the present invention is to provide a technique that can easily initialize a magnetization state of a magnetic recording layer having perpendicular magnetic anisotropy with regard to a domain wall motion type MRAM.

In a first aspect of the present invention, a domain wall motion type MRAM is provided. The MRAM has: a magnetic recording layer being a ferromagnetic layer having perpendicular magnetic anisotropy in which a domain wall moves; and a pair of terminals used for supplying a current to the magnetic recording layer. The magnetic recording layer has: a first magnetization region connected to one of the pair of terminals; a second magnetization region connected to the other of the pair of terminals; and a magnetization switching region connecting between the first magnetization region and the second magnetization region and having reversible magnetization. A first pinning site, by which the domain wall is trapped, is formed at a boundary between the first magnetization region and the magnetization switching region. A second pinning site, by which the domain wall is trapped, is formed at a boundary between the second magnetization region and the magnetization switching region. A third pinning site, by which the domain wall is trapped, is formed within the first magnetization region.

In a second aspect of the present invention, an initializing method for the above-mentioned MRAM is provided. At a time of an actual operation of the above-mentioned MRAM, a magnetization direction of the first magnetization region is fixed in a first direction, and a magnetization direction of the second magnetization region is fixed in a second direction opposite to the first direction. The initializing method includes: (A) a step of applying a first external magnetic field in the first direction such that magnetization of whole of the magnetic recording layer is turned to the first direction; (B) a step of applying a second external magnetic field in the second direction with supplying a current between the pair of terminals such that magnetization of at least a part of the magnetization switching region is turned to the second direction and a pair of domain walls is formed in the magnetization switching region; (C) a step of applying a third external magnetic field in the second direction such that one of the pair of domain walls moves to the third pinning site while the other thereof passes through the second magnetization region to disappear; and (D) a step of applying a fourth external magnetic field in the first direction such that the domain wall at the third pinning site moves to the first pinning site or the second pinning site.

According to the present invention, it is possible to easily initialize a magnetization state of a magnetic recording layer having perpendicular magnetic anisotropy. As a result, a low power consumption domain wall motion type MRAM in which the write current is reduced can be achieved at low cost.

BRIEF DESCRIPTION OF DRAWINGS

The above and other objects, advantages and features of the present invention will be more apparent from the following description of certain exemplary embodiments taken in conjunction with the accompanying drawings.

DESCRIPTION OF EMBODIMENTS

An MRAM according to an exemplary embodiment of the present invention will be described below with reference to the attached drawings. The MRAM according to the present exemplary embodiment MRAM is a domain wall motion type MRAM that uses a magnetic layer having perpendicular magnetic anisotropy.

1. Configuration of Magnetic Memory Cell

Figure 1:
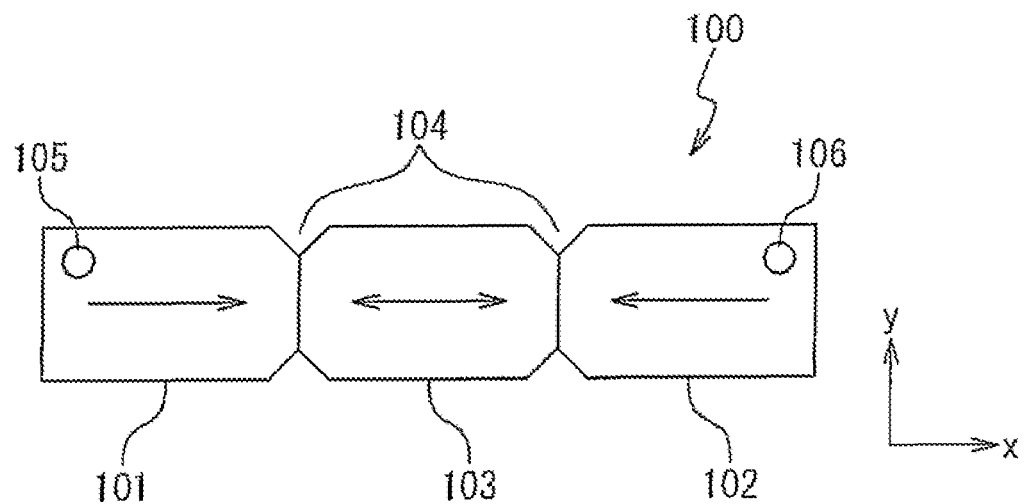
FIG. 1 is a plan view showing a magnetic recording layer of an MRAM described in a related document.
Figure 2:
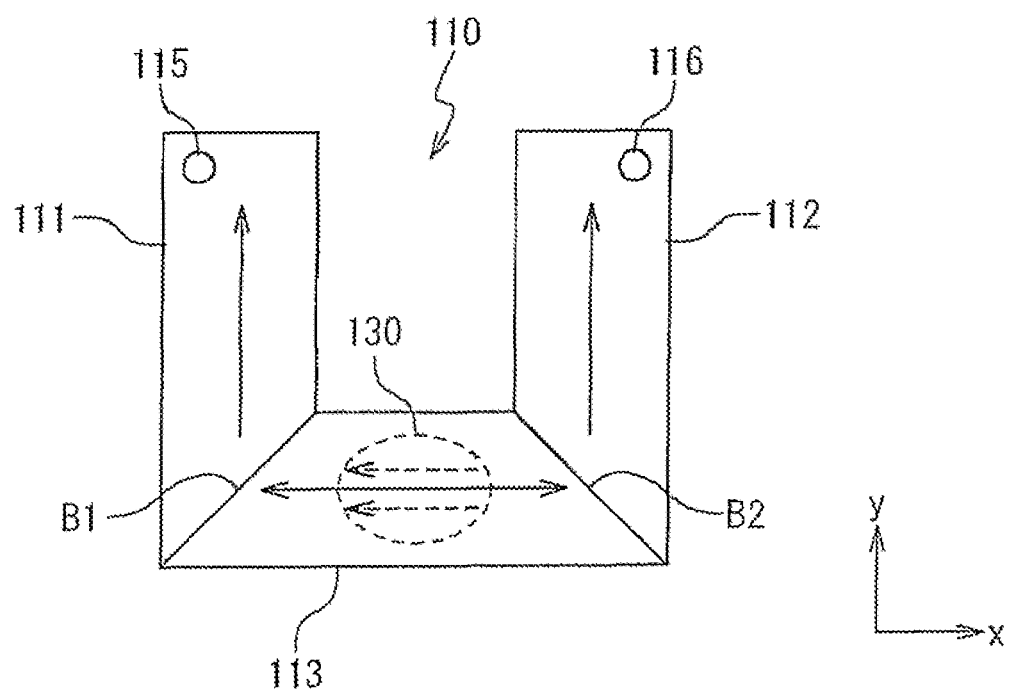
FIG. 2 is a plan view showing a magnetic recording layer of an MRAM described in another related document.
Figure 3A:
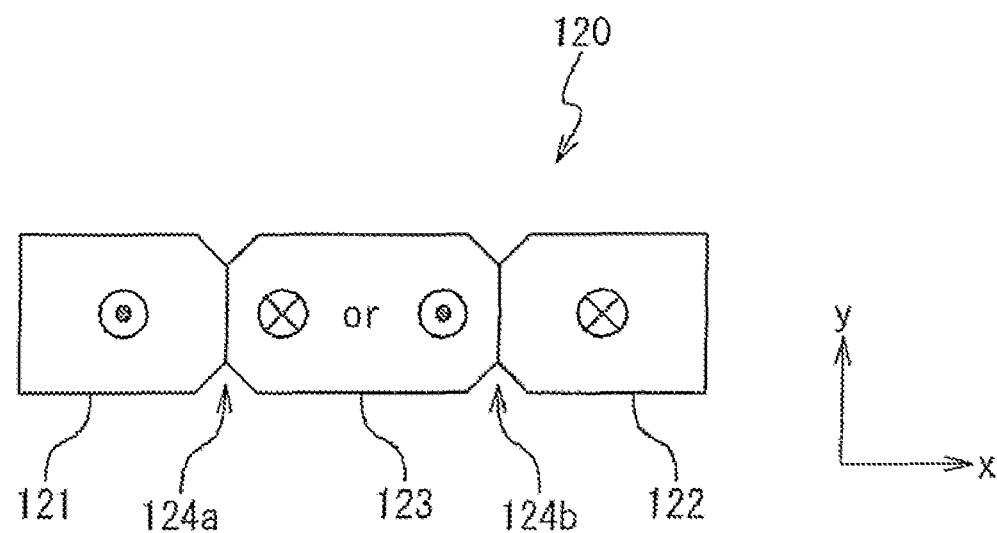
FIG. 3A is a plan view showing an example of a magnetic recording layer having perpendicular magnetic anisotropy.
Figure 3B:
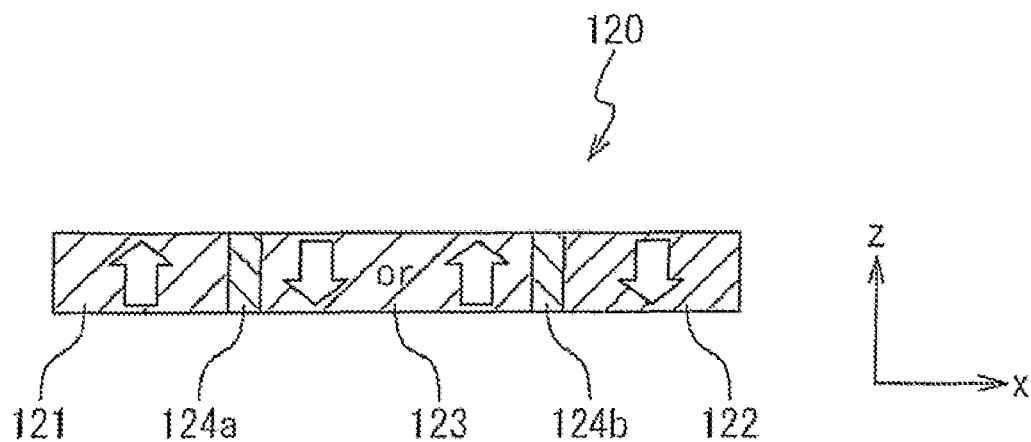
FIG. 3B is a cross-sectional view of the magnetic recording layer shown in FIG. 3A.
Figure 4A:
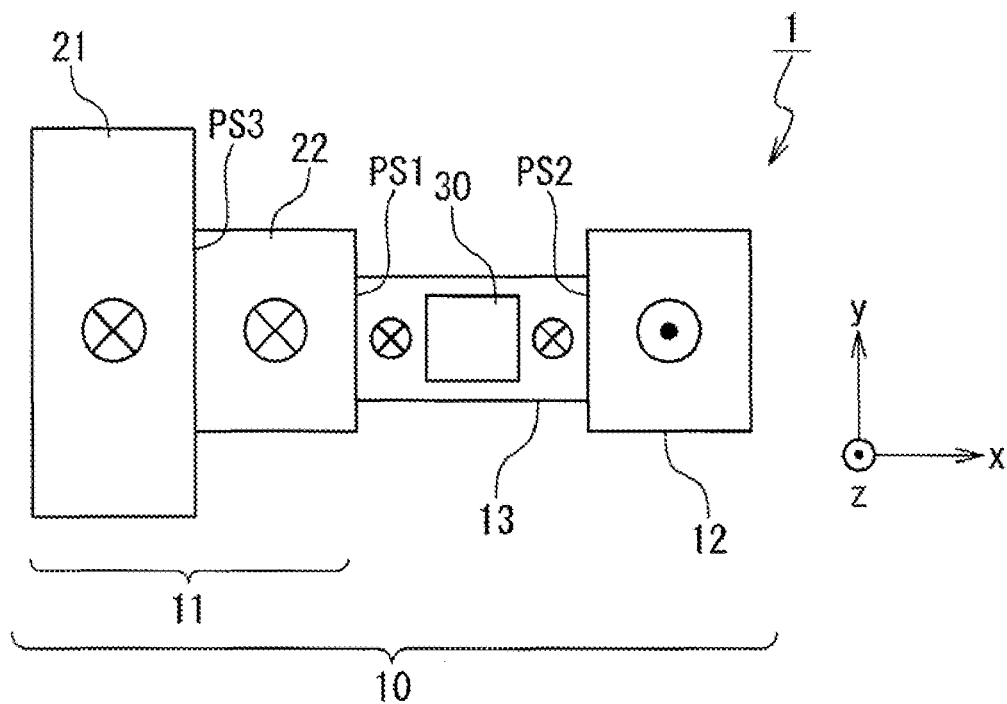
FIG. 4A is a plan view showing an example of a magnetic memory cell of an MRAM according to an exemplary embodiment of the present invention.
Figure 4B:
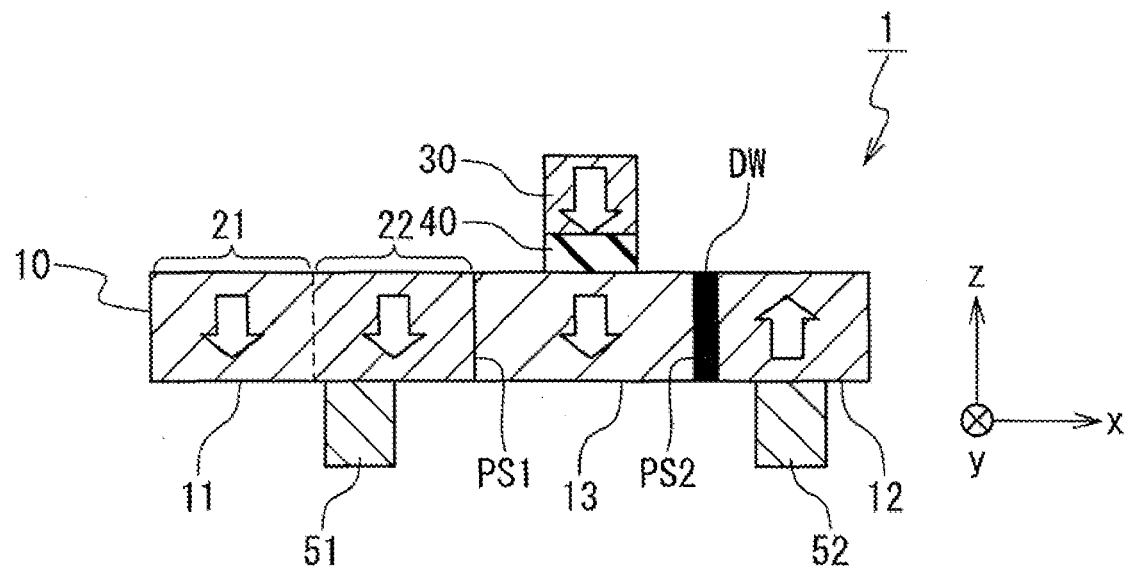
FIG. 4B is a cross-sectional view of the magnetic memory cell shown in FIG. 4A.

FIG. 4A is a plan view showing an example of a magnetic memory cell 1 (magnetoresistance element) of the MRAM according to the present exemplary embodiment. FIG. 4B is a cross-sectional view of the magnetic memory cell 1 shown in FIG. 4A. The magnetic memory cell 1 has a magnetic recording layer 10 and a pinned layer 30 each being a ferromagnetic layer, a tunnel barrier layer 40 being a non-magnetic layer, and a pair of current supply terminals 51 and 52 used for supplying a current to the magnetic recording layer 10.

The magnetic recording layer 10 has perpendicular magnetic anisotropy perpendicular to a substrate surface. The magnetic recording layer 10 preferably includes at least one material selected from Fe, Co and Ni. Moreover, the perpendicular magnetic anisotropy can be stabilized by adding Pt, Pd and the like. In addition to that, desired magnetic characteristics can be achieved by adding B, C, N, O, Al, Si, P, Ti, V, Cr, Mn, Cu, Zn, Zr, Nb, Mo, Tc, Ru, Rh, Ag, Hf, Ta, W, Re, Os, Ir, Au, Sm and the like. Concrete examples of the material include Co, Co—Pt, Co—Pd, Co—Cr, Co—Pt—Cr, Co—Cr—Ta, Co—Cr—B, Co—Cr—Pt—B, Co—Cr—Ta—B, Co—V, Co—Mo, Co—W, Co—Ti, Co—Ru, Co—Rh, Fe—Pt, Fe—Pd, Fe—Co—Pt, Fe—Co—Pd and Sm—Co.

Besides, the perpendicular magnetic anisotropy can be achieved also by stacking a layer including at least one material selected from Fe, Co and Ni and another layer. Concrete examples of the stacked film include Co/Pd, Co/Pt and Fe/Au.

The pinned layer 30 also preferably has perpendicular magnetic anisotropy, and its material is similar to that in the case of the magnetic recording layer 10. It should be noted that a magnetization direction of the pinned layer 30 is fixed and is not changed by write/read operations. It is therefore desirable that the magnetic anisotropy of the pinned layer 30 is greater than that of the magnetic recording layer 10. This can be achieved by varying the material and composition between the magnetic recording layer 10 and the pinned layer 30. This can also be achieved by stacking an anti-ferromagnetic layer on a surface of the pinned layer 30 on the opposite side of the tunnel barrier layer 40 to pin the magnetization. Moreover, the pinned layer 30 may be formed to be a laminated film of a ferromagnetic layer, a non-magnetic layer and a ferromagnetic layer. Here, Ru, Cu and the like can be used as the non-magnetic layer. The magnetization directions of the two ferromagnetic layers are anti-parallel to each other. A leakage magnetic field from the pinned layer can be suppressed by making the respective magnetizations of the two ferromagnetic layers substantially equal to each other.

The tunnel barrier layer 40 is a thin insulating film such as an Al2O3 film and an MgO film. The tunnel barrier layer 40 is sandwiched by the magnetic recording layer 10 and the pinned layer 30. The magnetic recording layer 10, the tunnel barrier layer 40 and the pinned layer 30 form a magnetic tunnel junction (MTJ). Such materials as CoFe and CoFeB exhibiting great TMR effect may be used for a part of the magnetic recording layer 10 and the pinned layer 30, particularly for a section being in contact with the tunnel barrier layer 40.

As shown in FIGS. 4A and 4B, the magnetic recording layer 10 according to the present exemplary embodiment has a first magnetization fixed region 11, a second magnetization fixed region 12 and a magnetization switching region 13. The first magnetization fixed region 11 and the second magnetization fixed region 12 are formed on both sides of the magnetization switching region 13. The magnetization switching region 13 is sandwiched between the magnetization fixed regions 11 and 12 and extends in an X axis so as to connect between the magnetization fixed regions 11 and 12. The first magnetization fixed region 11, the second magnetization fixed region 12 and the magnetization switching region 13 are formed in the same plane (XY plane). The magnetization switching region 13 among them overlaps with the pinned layer 30 and is connected to the pinned layer 30 through the tunnel barrier layer 40. Meanwhile, the first magnetization fixed region 11 and the second magnetization fixed region 12 are electrically connected to the pair of current supply terminals 51 and 52, respectively.

An example of the magnetization state after initialization which will be described later is illustrated by arrows in FIGS. 4A and 4B. In the magnetic recording layer 10, the magnetization directions of the first magnetization fixed region 11 and the second magnetization fixed region 12 are fixed. In particular, the magnetizations of the first magnetization fixed region 11 and the second magnetization fixed region 12 are fixed in the opposite directions (anti-parallel to each other). Since the magnetic recording layer 10 has the perpendicular magnetic anisotropy as described above, the magnetizations of the first magnetization fixed region 11 and the second magnetization fixed region 12 are fixed in the opposite directions along the Z direction. In the example shown in FIGS. 4A and 4B, the magnetization of the first magnetization fixed region 11 is fixed in the −Z direction, and the magnetization of the second magnetization fixed region 12 is fixed in the +Z direction. It should be noted that "magnetization being fixed" means that the magnetization direction does not change between before and after a write operation. Even if the magnetization direction of a part of the magnetization fixed region is changed during the write operation, it returns back after the write operation is ended.

On the other hand, the magnetization direction of the magnetization switching region 13 is reversible and can be the +Z direction or the −Z direction. That is, the magnetization of the magnetization switching region 13 is allowed to be parallel or anti-parallel to the magnetization of the pinned layer 30. As shown in FIG. 4B, in a case where the magnetization direction of the magnetization switching region 13 is the −Z direction, the magnetization switching region 13 and the first magnetization fixed region 11 form one magnetic domain while the second magnetization fixed region 12 forms another magnetic domain. That is, a domain wall DW is formed between the second magnetization fixed region 12 and the magnetization switching region 13. On the other hand, in a case where the magnetization direction of the magnetization switching region 13 is the +Z direction, the magnetization switching region 13 and the second magnetization fixed region 12 forms one magnetic domain while the first magnetization fixed region 11 forms another magnetic domain. That is, a domain wall DW is formed between the first magnetization fixed region 11 and the magnetization switching region 13.

Moreover, as shown in FIG. 4A, the first magnetization fixed region 11 and the second magnetization fixed region 12 are wider in the Y direction as compared with the magnetization switching region 13. This is for forming pinning sites, by which the domain wall is trapped, at respective boundaries between the magnetization fixed regions 11 and 12 and the magnetization switching region 13. Since energy of the domain wall is approximately proportional to a width of an element, the domain wall is more stabilized as the width becomes smaller. The domain wall in the magnetization fixed region 11 or 12 tends to move to the magnetization switching region 13, while the domain wall in the magnetization switching region 13 hardly moves to the magnetization fixed regions 11 and 12. Moreover, the domain wall is more likely to be pinned at the boundaries of the magnetization fixed regions 11 and 12 and the magnetization switching region 13, due to a static magnetic field from a section of the magnetization fixed regions 11 and 12 wider than the magnetization switching region 13. In this manner, the pinning site at which the domain wall tends to be trapped can be formed by varying the width of the magnetic recording layer 10. More specifically, the width in the Y direction at a boundary between the first magnetization fixed region 11 and the magnetization switching region 13 is larger on the side of the first magnetization fixed region 11 than on the side of the magnetization switching region 13. As a result, a "first pinning site PS1" is formed at the boundary between the first magnetization fixed region 11 and the magnetization switching region 13. Similarly, the width in the Y direction at a boundary between the second magnetization fixed region 12 and the magnetization switching region 13 is larger on the side of the second magnetization fixed region 12 than on the side of the magnetization switching region 13. As a result, a "second pinning site PS2" is formed at the boundary between the second magnetization fixed region 12 and the magnetization switching region 13.

Furthermore, according to the present exemplary embodiment, a "third pinning site PS3" is formed within the first magnetization fixed region 11 or the second magnetization fixed region 12. In the example shown in FIGS. 4A and 4B, the third pinning site PS3 is formed in the first magnetization fixed region 11. More specifically, the first magnetization fixed region 11 includes a first region 21 and a second region 22. The second region 22 is sandwiched between the first region 21 and the magnetization switching region 13. The first region 21 is so formed as to be wider than the second region 22, and the width in the Y direction at a boundary between the first region 21 and the second region 22 is larger on the side of the first region 21 than on the side of the second region 22. As a result, the third pinning site PS3 is formed at the boundary between the first region 11 and the second region 12 within the first magnetization fixed region 11. As shown in FIG. 4A, the width of the first region 21 is larger than the width of the second region 22 and the width of the second magnetization fixed region 12. Therefore, the domain wall is trapped more stably by the third pinning site PS3 than by the above-mentioned first pinning site PS1 and second pinning site PS2. In other words, the magnetic recording layer 10 is formed such that the third pinning site PS3 is stronger than the first pinning site PS1 and the second pinning site PS2.

It should be noted that the current supply terminals 51 and 52 are connected to the first magnetization fixed region 11 and the second magnetization fixed region 12, respectively. In particular, the current supply terminal 51 is connected to the second region 22 between the first pinning site PS1 and the third pinning site PS3 in the first magnetization fixed region 11. When a current is supplied between the current supply terminals 51 and 52, the current flows in the in-plane direction in the second region 22, the magnetization switching region 13 and the second magnetization fixed region 12 in the magnetic recording layer 10.

2. Initialization of Magnetization State

Figure 5:
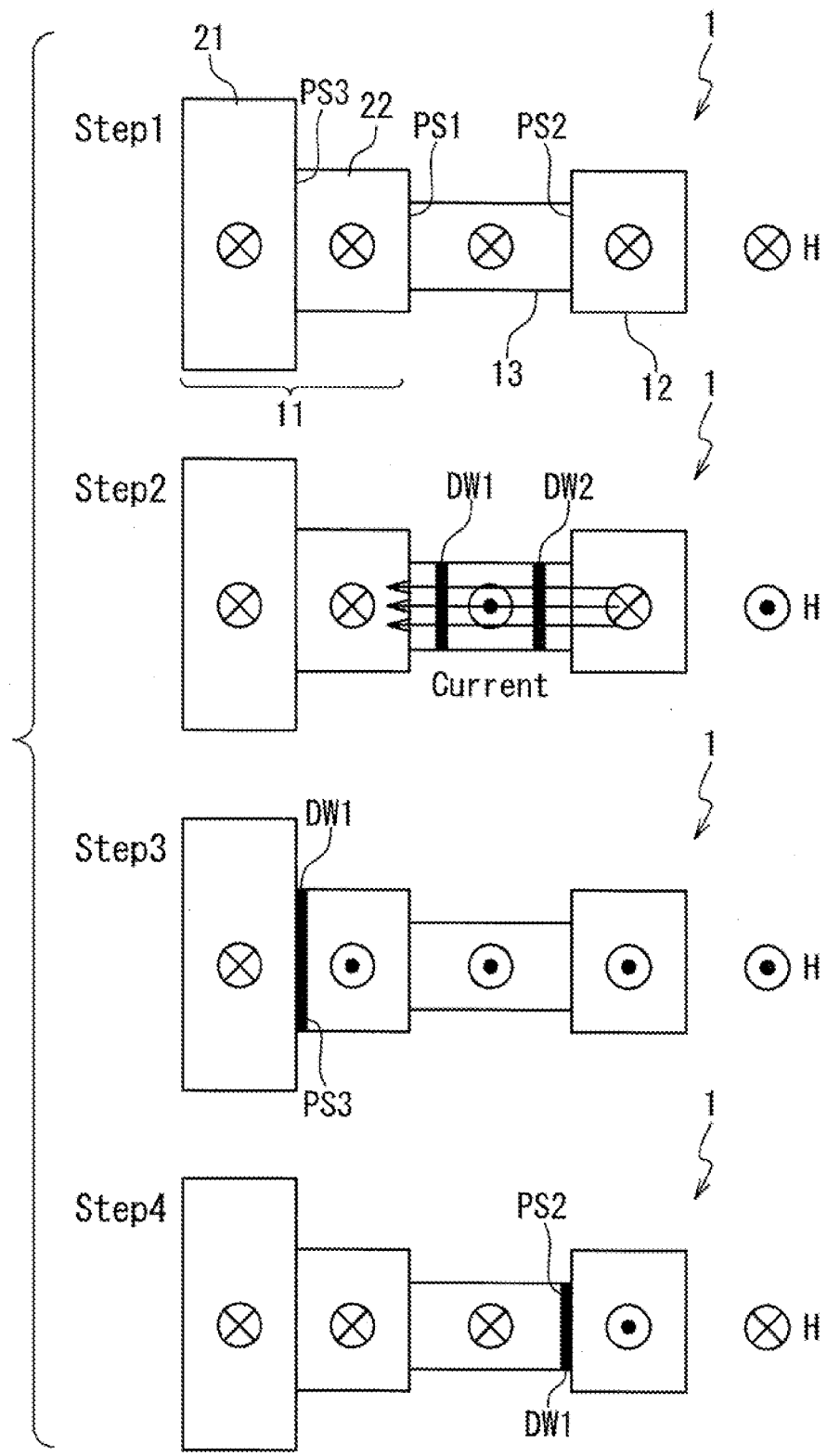
FIG. 5 is a plan view for explaining a method of initializing a magnetization state of a magnetic recording layer according to the exemplary embodiment of the present invention.

Next, a method of initializing the magnetization state of the magnetic memory cell 1 according to the present exemplary embodiment will be described. FIG. 5 is a plan view illustrating the magnetization state of the magnetic recording layer 10 during the initialization process. Here, let us consider a case where the pinned layer 30 has greater coercive force than the magnetic recording layer 10 and its magnetization direction does not change during the initialization process, and it is not shown in the figure.

Step 1:
First, an external magnetic field H (first external magnetic field) in the −Z direction is applied. The external magnetic field H is sufficiently strong, and the magnetization of whole of the magnetic recording layer 10 is turned to the −Z direction.

Step 2:
Next, an external magnetic field H (second external magnetic field) in the +Z direction is applied under a condition that a current is supplied between the current supply terminals 51 and 52. When the external magnetic field H is increased gradually, the magnetization of at least a part of the magnetization switching region 13 is reversed and turned to the +Z direction. This is because generation of reversal nucleus at this section is accelerated by the current and saturation magnetization, coercive force and the like are decreased due to the Joule heating. Since the magnetization direction of a part of the magnetization switching region 13 is turned to the +Z direction, a pair of domain walls DW1 and DW2 is generated in the magnetization switching region 13.

Step 3:
Subsequently, the external magnetic field H (third external magnetic field) in the +Z direction is further increased, and then the region where the magnetization is reversed to be directed to the +Z direction expands. That is to say, the pair of domain walls DW1 and DW2 respectively move outward. One domain wall DW1 arrives at the first pinning site PS1 and further intrudes into the first magnetization fixed region 11 and moves through the second region 22 to the third pinning site PS3. The other domain wall DW2 arrives at the second pinning site PS2 and further intrudes into the second magnetization fixed region 12 and moves through the second magnetization fixed region 12 to reach an end of the magnetic recording layer 10. That is, the domain wall DW2 passes through the second magnetization fixed region 12 to disappear. In this manner, one of the domain walls DW1 and DW2 is trapped by the third pinning site PS3, and the other thereof goes out of the magnetic recording layer 10. To this end, it is desirable that the third pinning site PS3 is stronger than the first pinning site PS1 and the second pinning site PS2. It should be noted that ON/OFF of the current is arbitrary in this Step 3. If the current is turned ON, the above-mentioned Joule heating effect can be obtained, which can enlarge margin of the application magnetic field.

Step 4:

Next, an external magnetic field H (fourth external magnetic field) in the −Z direction with a proper magnitude is applied. As a result, the domain wall DW1 at the third pinning site PS3 is driven toward the magnetization switching region 13, passes the first pinning site PS1, passes through the magnetization switching region 13 and stops at the second pinning site PS2. This is because mobility of the domain wall at a boundary where the width changes as described above is asymmetry. It should be noted that the magnitude of the external magnetic field H in the Step 4 is preferably smaller than the magnitude of the external magnetic field H in the Step 3.

Due to the processes described above, the domain wall position is initialized to the boundary between the magnetization switching region 13 and the second magnetization fixed region 12, and thus the magnetization state shown in FIG. 4A and FIG. 4B can be obtained. It goes without saying that in the above-described initialization operation, the magnetization state can be properly initialized even when the direction of the external magnetic field H is totally set to the opposite direction. According to the present exemplary embodiment, as described above, it is possible to easily initialize the magnetization state of the magnetic recording layer 10 having perpendicular magnetic anisotropy. As a result, a low power consumption domain wall motion type MRAM in which the write current is reduced can be achieved at low cost.

Regarding the above-described initializing method, when influence of the Joule heating due to the current is eliminated, the following relational expressions are satisfied.

$$Hp1 < H1 \quad (1)$$

$$Hp2 < H1 \quad (2)$$

$$Hr1 < H2 < Hp2 \quad (3)$$

Hr1: a depinning magnetic field required for depinning the domain wall at the first pinning site PS1 toward the magnetization switching region 13.

Hp1: a depinning magnetic field required for depinning the domain wall at the first pinning site PS1 toward the first magnetization fixed region 11.

Hr2: a depinning magnetic field required for depinning the domain wall at the second pinning site PS2 toward the magnetization switching region 13.

Hp2: a depinning magnetic field required for depinning the domain wall at the second pinning site PS2 toward the second magnetization fixed region 12.

H1: a depinning magnetic field required for depinning the domain wall at the third pinning site PS3 toward the first region 21.

H2: a depinning magnetic field required for depinning the domain wall at the third pinning site PS3 toward the second region 22.

Moreover, even when the condition regarding the depinning magnetic field H2 in the above-described relational expressions is "H2<Hr1", the initialization is possible. In this case, in the Step 4 shown in FIG. 5, the domain wall DW1 stops at the first pinning site PS1 being the boundary between the first fixed magnetization region 11 and the magnetization switching region 13. Such a condition on the depinning magnetic field can be achieved by adjusting a configuration of the pinning site.

3. Write Operation, Read Operation

Figure 6:
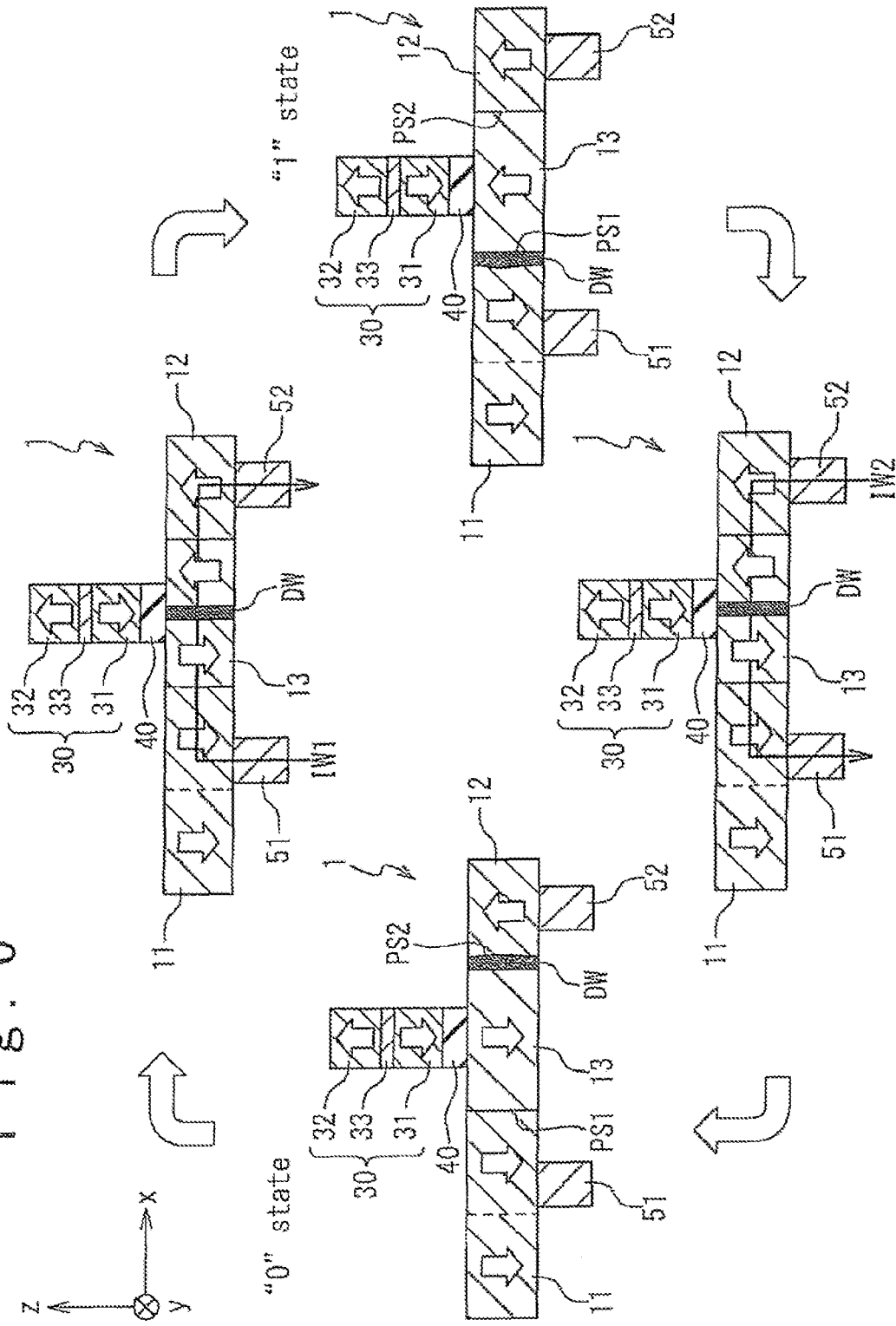
FIG. 6 is a conceptual diagram for explaining a principle of data writing in the exemplary embodiment of the present invention.

FIG. 6 shows a principle of data writing for the magnetic memory cell 1. It should be noted that in the present example, a ferri-magnetic layer in which a first pinned magnetic layer 31, a non-magnetic layer 33 and a second pinned magnetic layer 32 are stacked is used as the pinned layer 30. A magnetization direction of the first pinned magnetic layer 31 is fixed in the −Z direction. A state in which the magnetization directions of the magnetization switching region 13 and the first pinned magnetic layer 31 are parallel to each other is related to data "0". In the data "0" state, the magnetization direction of the magnetization switching region 13 is the −Z direction, and the domain wall DW exists at the second pinning site PS2. On the other hand, a state in which the magnetization directions of the magnetization switching region 13 and the first pinned magnetic layer 31 are anti-parallel to each other is related to data "1". In the data "1" state, the magnetization direction of the magnetization switching region 13 is the +Z direction, and the domain wall DW exists at the first pinning site PS1.

The data writing is achieved by the current-driven domain wall motion method utilizing the spin transfer. The write current flows not in a direction penetrating through the MTJ but planarly in the magnetic recording layer 10. To this end, the above-mentioned current supply terminals 51 and 52 are used, and the write current is supplied between the current supply terminals 51 and 52.

At a time of writing the data "1", a first write current IW1 flows from the first magnetization fixed region 11 to the second magnetization fixed region 12 through the magnetization switching region 13. In this case, spin electrons are injected from the second magnetization fixed region 12 into the magnetization switching region 13. The spin of the injected electrons drives the domain wall DW at the second pinning site PS2 toward the first magnetization fixed region 11. As a result, the domain wall DW moves to the first pinning site PS1, and the magnetization direction of the magnetization switching region 13 is switched to the +Z direction. On the other hand, at a time of writing the data "0", a second write current IW2 flows from the second magnetization fixed region 12 to the first magnetization fixed region 11 through the magnetization switching region 13. In this case, spin electrons are injected from the first magnetization fixed region 11 into the magnetization switching region 13. As a result, the domain wall DW moves to the second pinning site PS2, and the magnetization direction of the magnetization switching region 13 is switched to the −Z direction.

In this manner, the domain wall DW moves by the write currents IW1 and IW2 which flows planarly in the magnetic recording layer 10 and the magnetization direction of the magnetization switching region 13 is switched. The first magnetization fixed region 11 and the second magnetization fixed region 12 serve as supply sources of the electrons having different spins. According to the present exemplary embodiment, since the perpendicular magnetic anisotropy material is applied to the magnetic recording layer 10, the write current can be reduced as compared with a case of in-plane magnetic anisotropy.

A data read operation is as follows. At the time of data reading, a read current is so supplied as to flow between the pinned layer 30 and the magnetization switching region 13. For example, the read current flows from any of the magnetization fixed regions 11 and 12 to the pinned layer 30 through the magnetization switching region 13 and the tunnel barrier layer 40. Alternatively, the read current flows from the pinned layer 30 to any of the magnetization fixed regions 11 and 12 through the tunnel barrier layer 40 and the magnetization switching region 13. Based on the read current or a read potential, a resistance value of the MTJ is detected and the magnetization direction of the magnetization switching region 13 is sensed.

4. Modification Examples

A structure that can achieve the initializing method according to the present exemplary embodiment is not limited to the one shown in the foregoing FIGS. 4A and 4B. FIGS. 7, 8, 9, 10A and 10B show modification examples of the magnetic memory cell 1 according to the present exemplary embodiment. A description overlapping the foregoing description will be omitted as appropriate.

Figure 7:
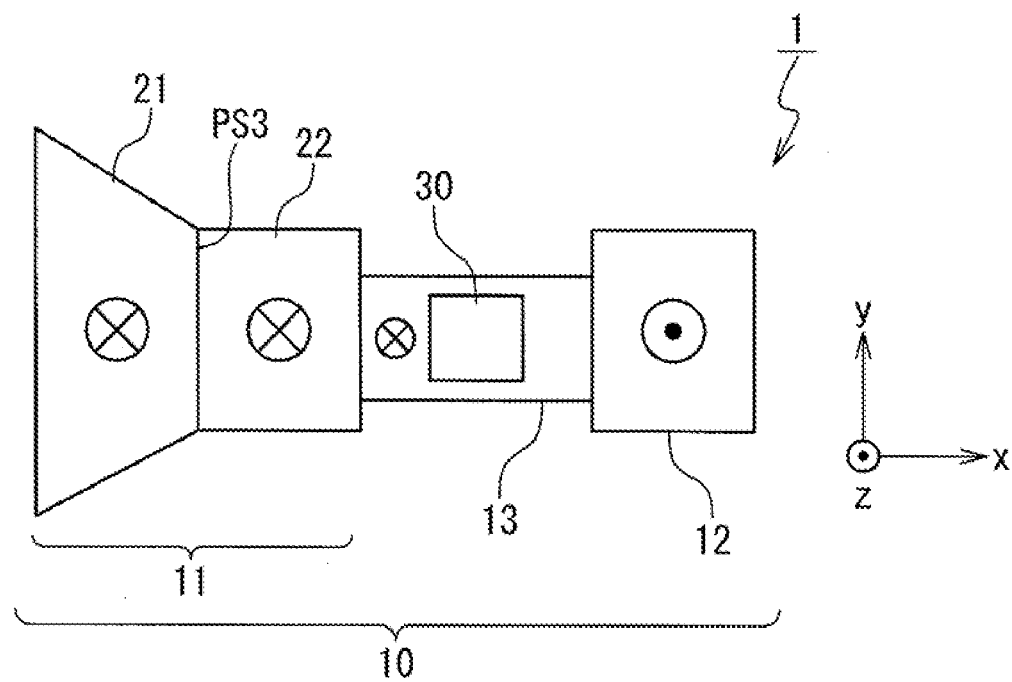
FIG. 7 is a plan view showing a modification example of the magnetic memory cell according to the exemplary embodiment of the present invention.

In FIG. 7, a width in the Y direction of the first region 21 becomes larger as way from the boundary between the first region 21 and the second region 22 towards inside of the first region 21. That is, the magnetic recording layer 10 is formed such that the width of the first region 21 becomes gradually larger as compared with the width of the second region 22. As a result, the third pinning site PS3 satisfying the above-mentioned relational expressions regarding the depinning magnetic field is formed at the boundary between the first region 21 and the second region 22.

Figure 8:
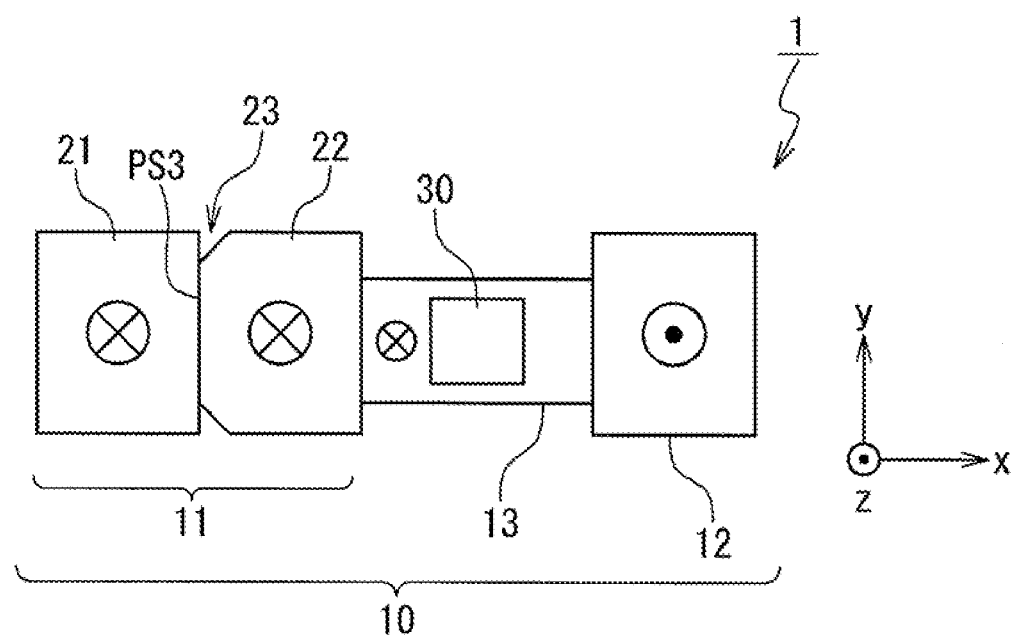
FIG. 8 is a plan view showing another modification example of the magnetic memory cell according to the exemplary embodiment of the present invention.

In FIG. 8, a constricted section 23 adjacent to the boundary between the first region 21 and the second region 22 is formed on the side of the second region 22. That is, an asymmetric constricted section 23 is provided between the first region 21 and the second region 22. Also in this case, the width in the Y direction at the boundary between the first region 21 and the second region 22 becomes larger on the side of the first region 21 than on the side of the second region 22. As a result, the third pinning site PS3 satisfying the above-mentioned relational expressions regarding the depinning magnetic field is formed at the boundary between the first region 11 and the second region 12.

Figure 9:
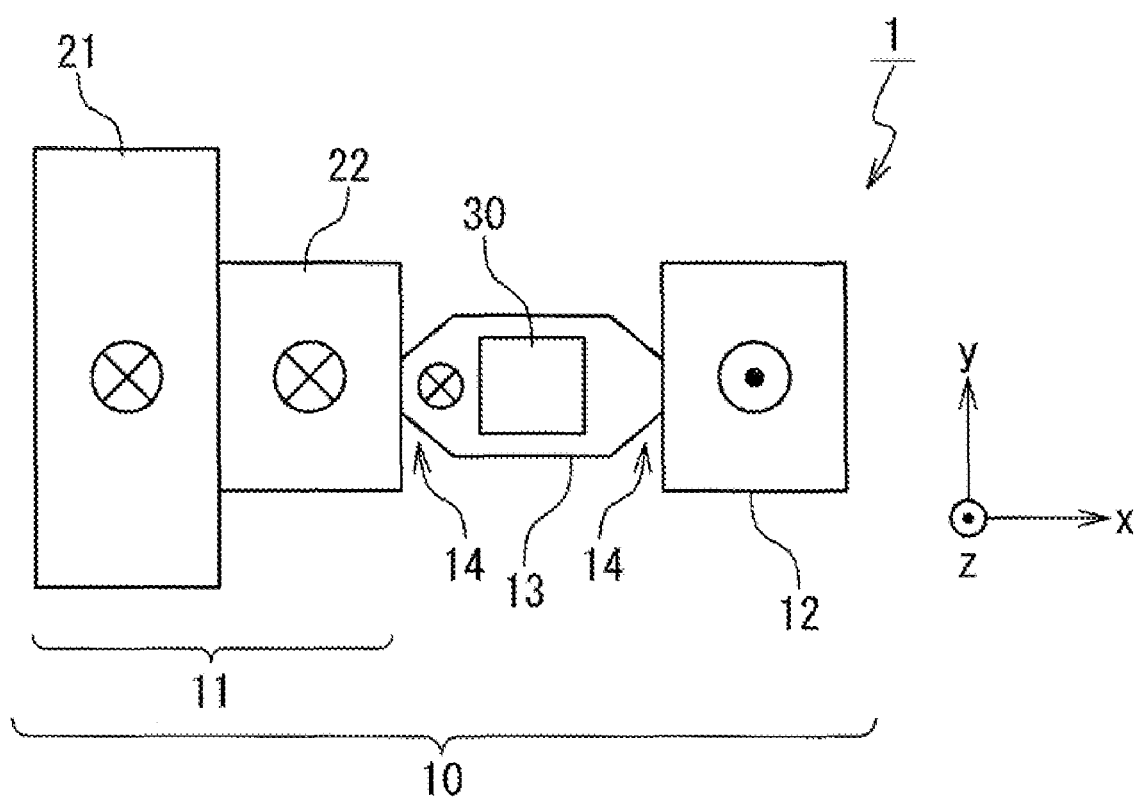
FIG. 9 is a plan view showing a still another modification example of the magnetic memory cell according to the exemplary embodiment of the present invention.

In FIG. 9, constricted sections 14 adjacent to the boundaries between the magnetization fixed regions 11 and 12 and the magnetization switching region 13 are formed on the side of the magnetization switching region 13. That is, asymmetric constricted sections 14 are provided between the magnetization fixed regions 11 and 12 and the magnetization switching region 13. As a result, the first pinning site PS1 an the second pinning site PS2 satisfying the above-mentioned relational expressions regarding the depinning magnetic field are formed.

Figure 10A:
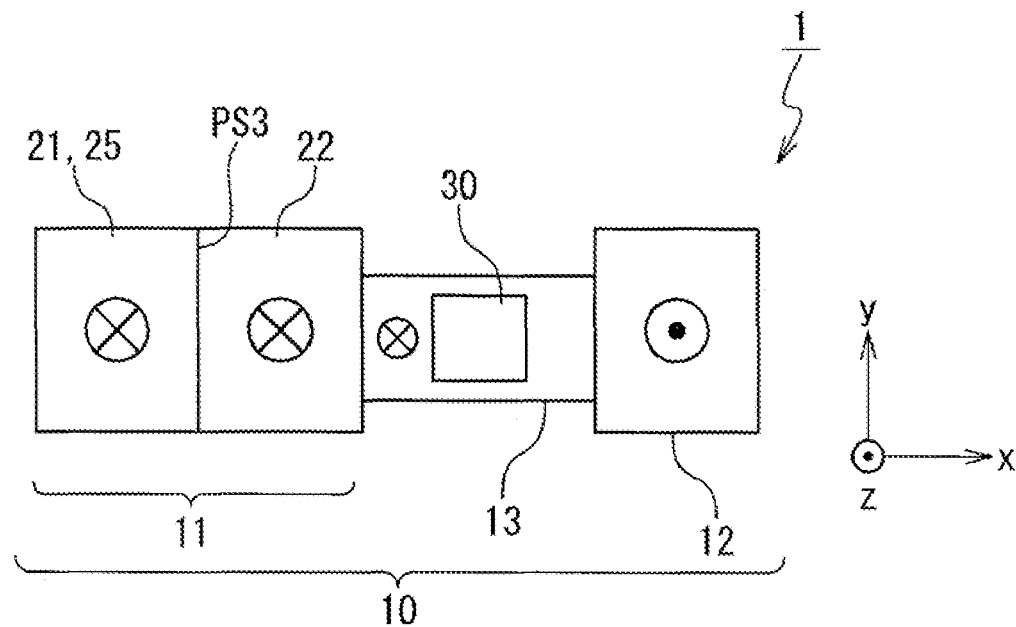
FIG. 10A is a plan view showing a still another modification example of the magnetic memory cell according to the exemplary embodiment of the present invention.
Figure 10B:
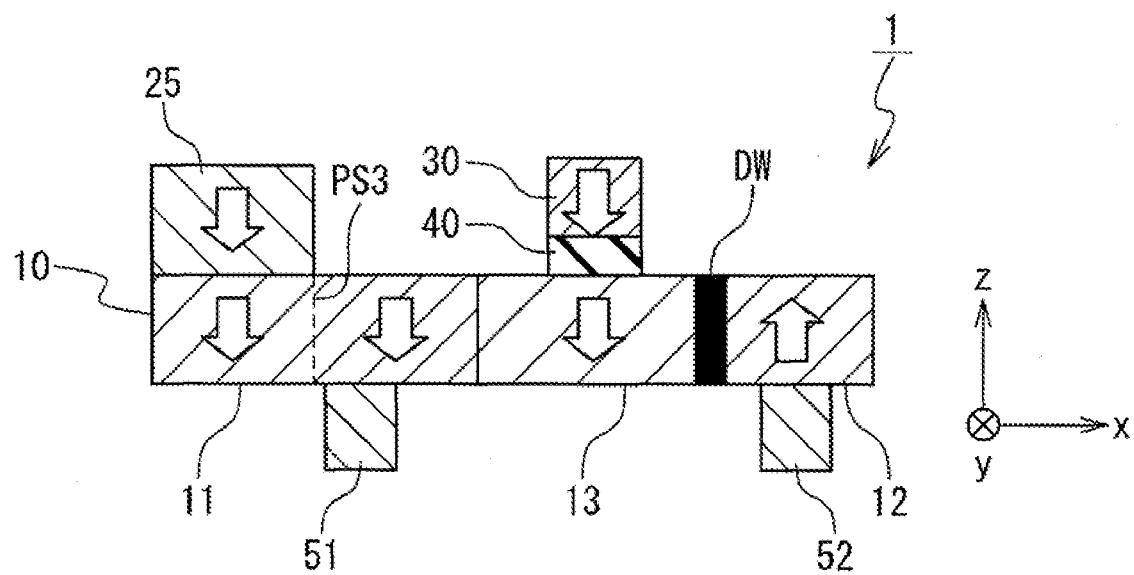
FIG. 10B is a cross-sectional view of the magnetic memory cell shown in FIG. 10A.

FIGS. 10A and 10B respectively are a plan view and a cross-sectional view showing still another modification example. In FIGS. 10A and 10B, the width along the Y direction is the same between the first region 21 and the second region 22 of the first magnetization fixed region 11. However, a hard magnetic layer 25 is stacked on the first region 21 that is not in contact with the magnetization switching region 13. Due to a leakage magnetic field from the hard magnetic layer 25, the third pinning site PS3 satisfying the above-mentioned relational expressions regarding the depinning magnetic field is formed at the boundary between the first region 21 and the second region 22.

As described above, the pinning site can be formed by the difference in the width of the magnetic recording layer, the asymmetric constricted section, the stack of the hard magnetic layer, and so forth. The strength of the pinning site can be adjusted by the difference in the width, depth of the constricted section, a thickness of the hard magnetic layer, and so forth. It is therefore possible by combining them to configure such the magnetic memory cell 1 that satisfies the above-mentioned conditions on the depinning magnetic field.

Figure 11A:
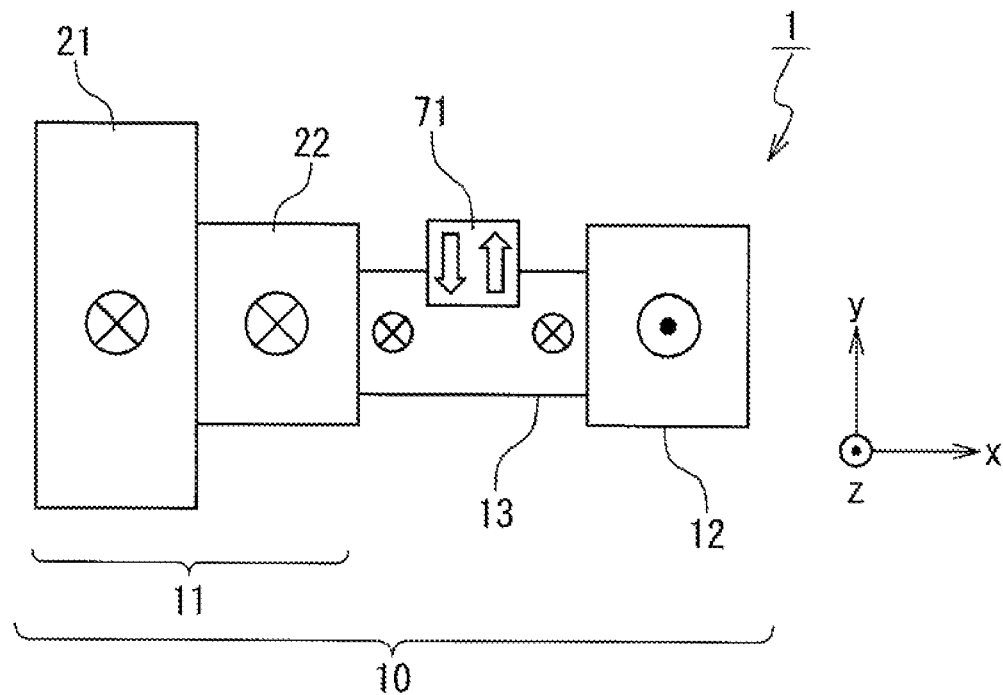
FIG. 11A is a plan view showing a still another modification example of the magnetic memory cell according to the exemplary embodiment of the present invention.
Figure 11B:
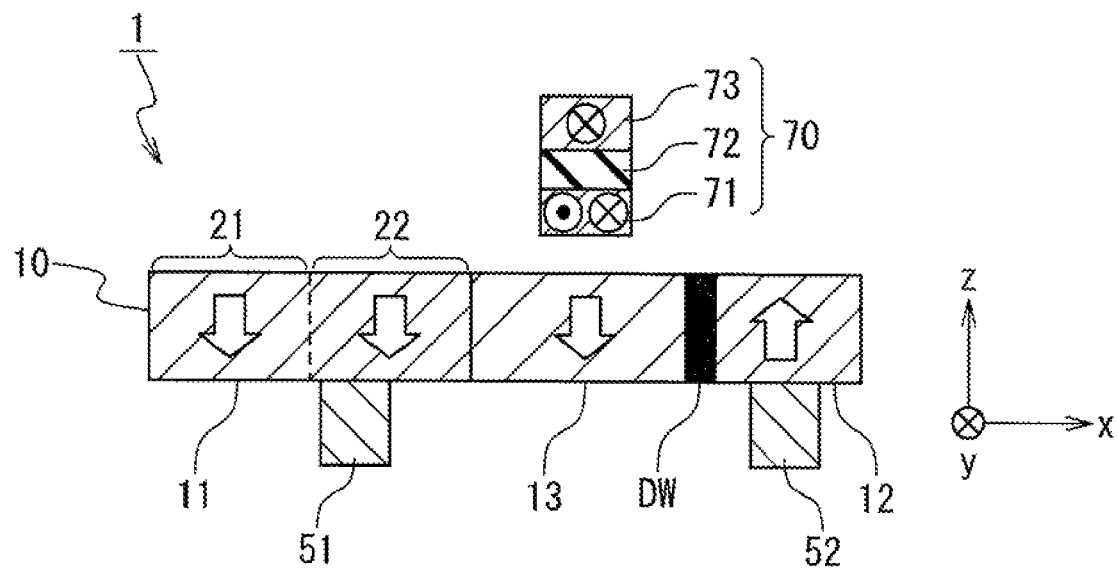
FIG. 11B is a cross-sectional view of the magnetic memory cell shown in FIG. 11A.

FIGS. 11A and 11B respectively are a plan view and a cross-sectional view showing still another modification example. In the example shown in FIGS. 11A and 11B, an MTJ 70 used for the data reading is provided separately from the magnetic recording layer 10. The MTJ 70 includes a magnetic sense layer 71, a tunnel barrier layer 72 and a pinned layer 73. The tunnel barrier layer 72 is sandwiched by the magnetic sense layer 71 and the pinned layer 73, and the magnetic sense layer 71 and the pinned layer 73 are connected to each other through the tunnel barrier layer 72.

A magnetization direction of the pinned layer 73 is fixed. On the other hand, the magnetic sense layer 71 has reversible magnetization and is magnetically coupled to the magnetization switching region 13 of the magnetic recording layer 10. Therefore, the magnetization state of the magnetization switching region 13 affects a magnetization state of the magnetic sense layer 71. When the magnetization direction of the magnetization switching region 13 is switched, the magnetization direction of the magnetic sense layer 71 also is switched. The data reading is performed by using the MTJ 70 to sense the magnetization direction of the magnetic sense layer 71.

The magnetic sense layer 71 and the pinned layer 73 may have perpendicular magnetic anisotropy or may have in-plane magnetic anisotropy. In the case of the in-plane magnetic anisotropy, it is desirable that a center of the magnetic sense layer 71 in the XY plane is displaced from a center of the magnetization switching region 13 in the XY plane, in order to efficiently transmit the magnetization state in the perpendicular direction of the magnetization switching region 13 to the magnetization state in the in-plane direction of the magnetic sense layer 71. For example, as shown in FIG. 11A, it is preferable that the magnetic sense layer 71 partially overlap with the magnetization switching region 13.

In the case of the example shown in FIGS. 11A and 11B, the magnetic recording layer 10 in which the write current flows and the MTJ 70 in which the read current flows are completely separated from each other. It is therefore possible to design the magnetic recording layer 10 contributing to write characteristics and the MTJ 70 contributing to read characteristics independently of each other. As a result, it is possible to optimize both the write characteristics and the read characteristics, which is preferable.

5. Configuration of MRAM

Figure 12:
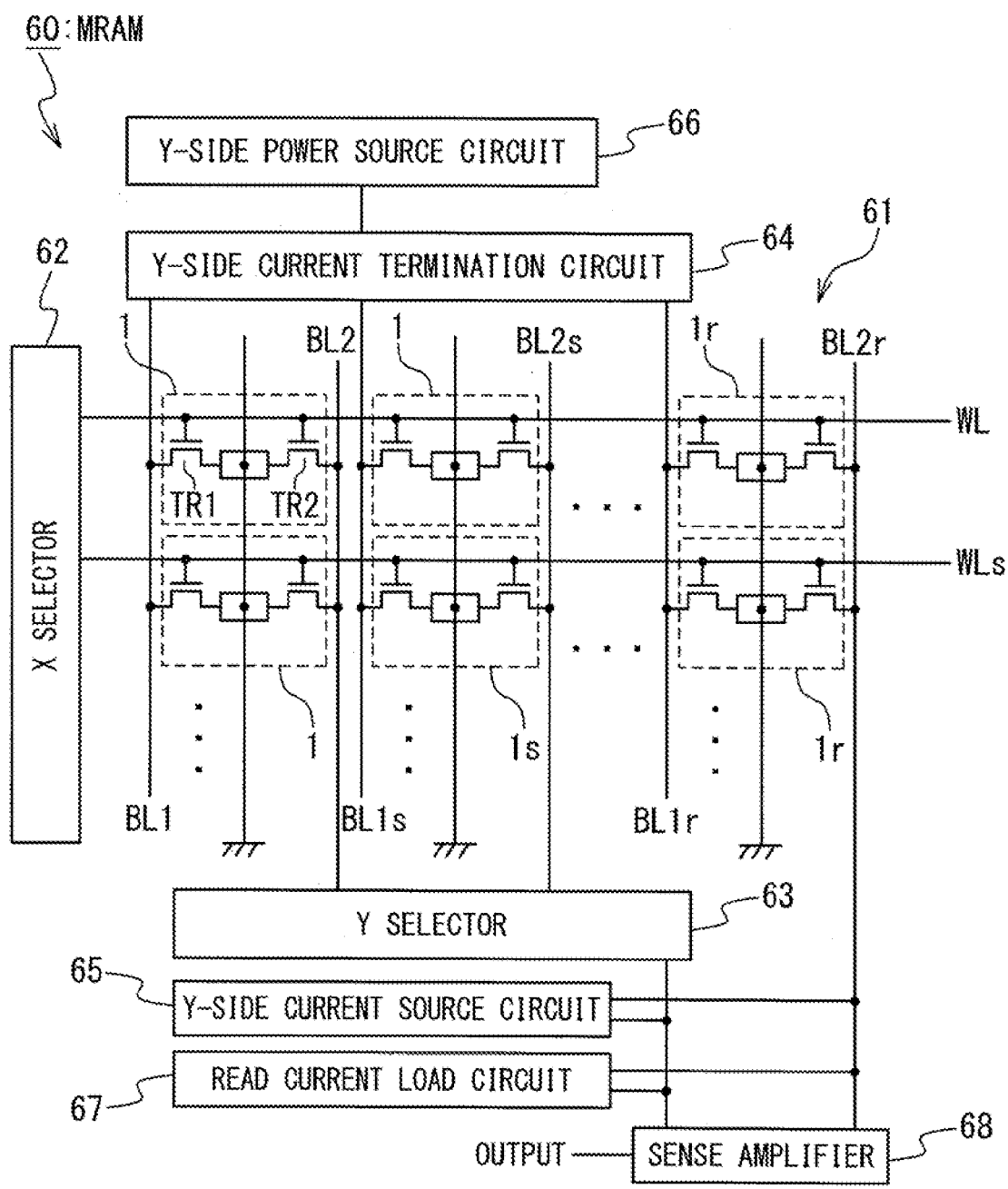
FIG. 12 is a block diagram showing an example of a circuit configuration of the MRAM according to the exemplary embodiment of the present invention.

FIG. 12 shows one example of a configuration of an MRAM according to the present exemplary embodiment. In FIG. 12, an MRAM 60 has a memory cell array 61 in which a plurality of magnetic memory cells 1 are arranged in a matrix form. The memory cell array 61 includes not only the magnetic memory cells 1 used for the data recording but also reference cells 1r which are referred to at the time of data reading. A structure of the reference cell 1r is the same as that of the magnetic memory cell 1.

Each magnetic memory cell 1 has select transistors TR1 and TR2 in addition to the magnetoresistance element described above. One of source/drain of the select transistor TR1 is connected to the current supply terminal 51 on the side of the first magnetization fixed region 11, and the other thereof is connected to a first bit line BL1. One of source/drain of the select transistor TR2 is connected to the current supply terminal 52 on the side of the second magnetization fixed region 12, and the other thereof is connected to a second bit line BL2. Gates of the select transistors TR1 and TR2 are connected to a word line WL. The pinned layer 30 of the magnetoresistance element is connected to a ground line through an electrode as illustrated.

The word line WL is connected to an X selector 62. In the data writing and reading, the X selector 62 selects a word line WL connected to a target memory cell is as a selected word line WLs. The first bit line BL1 is connected to a Y-side current termination circuit 64, and the second bit line BL2 is connected to a Y selector 63. The Y selector 63 selects a second bit line BL2 connected to the target memory cell is as a selected second bit line BL2s. The Y-side current termination circuit 64 selects a first bit line BL1 connected to the target memory cell is as a selected first bit line BL1s.

A Y-side current source circuit 65 supplies or draws a predetermined write current (IW1, IW2) with respect to the selected second bit line BL2s at the time of data writing. A Y-side power source circuit 66 supplies a predetermined voltage to the Y-side current termination circuit 64 at the time of data writing. As a result, the write current (IW1, IW2) flows into the Y selector 63 or flows out from the Y selector 63. The above-mentioned X selector 62, Y selector 63, Y-side current termination circuit 64, Y-side current source circuit 65 and Y-side power source circuit 66 constitute a "write current supply circuit" for supplying the write currents IW1 and IW2 to the magnetic memory cells 1.

At the time of data reading, the first bit line BL1 is set to "Open". A read current load circuit 67 supplies a predetermined read current to the selected second bit line BL2s. Also, the read current load circuit 67 supplies, the predetermined current to a reference second bit line BL2r which is connected to the reference cell 1r. A sense amplifier 68 senses data of the target memory cell is based on a difference between a potential of the reference second bit line BL2r and a potential of the selected second bit line BL2s, and outputs the data.

The exemplary embodiments of the present invention have been described above with reference to the attached drawings. However, the present invention is not limited to the above-described exemplary embodiments and can be appropriately modified by a person skilled in the art without departing from the scope of the invention.

This application is the National Phase of PCT/JP2008/072379, filed Dec. 10, 2008, which is based upon and claims the benefit of priority from Japanese patent application No. 2008-015489, filed on Jan. 25, 2008, the disclosure of which is incorporated herein in its entirely by reference.

The invention claimed is:

1. A magnetic random access memory of domain wall motion type comprising:
   a magnetic recording layer being a ferromagnetic layer having perpendicular magnetic anisotropy in which a domain wall moves; and
   a pair of terminals used for supplying a current to said magnetic recording layer,
   wherein said magnetic recording layer comprises:
   a first magnetization region connected to one of said pair of terminals;
   a second magnetization region connected to the other of said pair of terminals; and
   a magnetization switching region connecting between said first magnetization region and said second magnetization region and having reversible magnetization,
   wherein a first pinning site, by which the domain wall is trapped, is formed at a boundary between said first magnetization region and said magnetization switching region,
   a second pinning site, by which the domain wall is trapped, is formed at a boundary between said second magnetization region and said magnetization switching region, and
   a third pinning site, by which the domain wall is trapped, is formed within said first magnetization region.

2. The magnetic random access memory according to claim 1,
   wherein said magnetic recording layer is formed such that the domain wall is trapped more stably by said third pinning site than by said first pinning site and said second pinning site.

3. The magnetic random access memory according to claim 1,
   wherein said first magnetization region comprises:
   a first region; and
   a second region sandwiched between said first region and said magnetization switching region,
   wherein said third pinning site is formed at a boundary between said first region and said second region.

4. The magnetic random access memory according to claim 3,
   wherein a width of said magnetic recording layer at the boundary between said first region and said second region is larger on a side of said first region than on a side of said second region.

5. The magnetic random access memory according to claim 4,
   wherein a constricted section is so formed in said second region as to be adjacent to the boundary between said first region and said second region.

6. The magnetic random access memory according to claim 3,
   wherein a width of said first region becomes larger as away from the boundary between said first region and said second region towards inside of said first region.

7. The magnetic random access memory according to claim 3, further comprising: a magnetic layer formed on said first region.

8. The magnetic random access memory according to claim 3,
   wherein said pair of terminals is connected to said second region and said second magnetization region, respectively.

9. The magnetic random access memory according to claim 3,
   wherein a width of said magnetic recording layer at a boundary between said second region and said magnetization switching region is larger on a side of said second region than on a side of said magnetization switching region, and
   a width of said magnetic recording layer at the boundary between said second magnetization region and said magnetization switching region is larger on a side of said second magnetization region than on a side of said magnetization switching region.

10. The magnetic random access memory according to claim 3,
wherein magnetic fields required for depinning the domain wall at said first pinning site towards said magnetization switching region and said first magnetization region are Hr1 and Hp1, respectively,
magnetic fields required for depinning the domain wall at said second pinning site towards said magnetization switching region and said second magnetization region are Hr2 and Hp2, respectively, and
magnetic fields required for depinning the domain wall at said third pinning site towards said first region and said second region are H1 and H2, respectively, and
wherein the following relational expressions are satisfied:

$Hp1<H1;$ $Hp2<H1;$ and $Hr1<H2<Hp2.$

11. The magnetic random access memory according to claim 1,
wherein at a time of an actual operation, a magnetization direction of said first magnetization region is fixed in a first direction, and a magnetization direction of said second magnetization region is fixed in a second direction opposite to said first direction.

12. The magnetic random access memory according to claim 11, further comprising: a pinned layer being a ferromagnetic layer having perpendicular magnetic anisotropy and whose magnetization direction is fixed,
wherein said pinned layer is connected to said magnetization switching region through a non-magnetic layer.

13. The magnetic random access memory according to claim 11, further comprising:
a sense layer being a ferromagnetic layer magnetically coupled to said magnetization switching region and having reversible magnetization; and
a pinned layer being a ferromagnetic layer connected to said sense layer through a non-magnetic layer and whose magnetization direction is fixed.

\* \* \* \* \*